United States Patent
Izumi

(10) Patent No.: US 7,923,297 B2
(45) Date of Patent: Apr. 12, 2011

(54) MANUFACTURING METHOD OF SEMICONDUCTOR DEVICE

(75) Inventor: Naoki Izumi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/547,907

(22) Filed: Aug. 26, 2009

(65) Prior Publication Data
US 2009/0317945 A1    Dec. 24, 2009

Related U.S. Application Data

(62) Division of application No. 11/638,500, filed on Dec. 14, 2006, now Pat. No. 7,598,154.

(30) Foreign Application Priority Data

Jan. 20, 2006  (JP) ................................. 2006-012367

(51) Int. Cl.
*H01L 29/74* (2006.01)
(52) U.S. Cl. ............. 438/113; 438/33; 438/68; 438/460
(58) Field of Classification Search .................... 438/33, 438/68, 113–114, 460–644
See application file for complete search history.

(56) References Cited

U.S. PATENT DOCUMENTS

| | | | |
|---|---|---|---|
| 5,905,559 A | 5/1999 | Fujiwara et al. | |
| 7,247,524 B2 | 7/2007 | Kakagawa | |
| 7,250,354 B2 * | 7/2007 | Uchida | 438/460 |
| 7,253,027 B2 * | 8/2007 | Kanakubo | 438/113 |
| 7,264,997 B2 * | 9/2007 | Kameyama et al. | 438/113 |
| 2002/0149295 A1 | 10/2002 | Onishi et al. | |
| 2008/0003926 A1 | 1/2008 | Watanabe et al. | |

FOREIGN PATENT DOCUMENTS

| | | |
|---|---|---|
| JP | 64-085712 | 3/1989 |
| JP | 5-198670 A | 8/1993 |
| JP | 09-171977 | 6/1997 |
| JP | 09-326373 | 12/1997 |
| JP | 2003-173986 | 6/2003 |
| JP | 2003-197564 A | 7/2003 |
| JP | 2004-349275 | 12/2004 |
| JP | 2005-129742 | 5/2005 |
| JP | 2005-129743 | 5/2005 |
| JP | 2005-158855 A | 6/2005 |
| JP | 2005-175148 | 6/2005 |
| JP | 2005-191436 | 7/2005 |

OTHER PUBLICATIONS

Japanese Office Action issued in Japanese Patent Application No. 2009-006235, dated Sep. 1, 2009.

* cited by examiner

*Primary Examiner* — Dung A. Le
(74) *Attorney, Agent, or Firm* — McDermott Will & Emery LLP

(57) ABSTRACT

Size of a chipping is made small, suppressing blinding of a blade, when performing dicing of a wafer.
When cutting a wafer, cutting is performed so that the portion of a V character-shaped shoulder may enter below the front surface of a wafer (depth $Z_2$ from a substrate front surface) using the metal-bond blade which includes the abrasive particle whose fineness number is more than #3000, and whose point is V character form. By processing it in this way, cutting resistance goes up and blinding of a blade can be prevented. Hereby, the size of a chipping can be suppressed small, preventing blinding of a blade.

3 Claims, 14 Drawing Sheets

MANUFACTURING METHOD OF SEMICONDUCTOR DEVICE

CROSS-REFERENCE TO RELATED APPLICATIONS

The present application is a divisional of U.S. application Ser. No. 11/638,500, filed Dec. 14, 2006, now U.S. Pat. No. 7,598,154, which claims priority from Japanese Patent Application No. 2006-012367 filed on Jan. 20, 2006, the contents of which are hereby incorporated by reference into this application.

FIELD OF THE INVENTION

The present invention relates to a manufacturing method of a semiconductor device, and particularly relates to a manufacturing method of a semiconductor device having a step which cuts the wafer in which low dielectric constant films, such as an SiOC film, were formed on the substrate, by a dicing blade.

DESCRIPTION OF THE BACKGROUND ART

In the manufacturing method of a semiconductor device, after the manufacturing process on a wafer is completed, it is cut by the dicing blade etc. per semiconductor chip. In recent years, low dielectric constant films, such as SiOC, are formed on the wafer for the capacity reduction between wirings.

Since a low dielectric constant film is a vulnerable film, when cutting the wafer on which the low dielectric constant film was formed, by a dicing blade, a crack enters easily, and dicing failure may be caused. For this reason, when doing dicing of the above-mentioned wafer, it is disclosed by Patent Reference 1 about the technology of using a resin bonding blade or a metal resin bonding blade. (For example, refer to Patent Reference 1).

[Patent Reference 1] Japanese Unexamined Patent Publication No. 2003-197564

SUMMARY OF THE INVENTION

Since the blade surface of a resin bonding blade is soft, its damage given to a wafer is small. For this reason, peeling and a crack generation of a low dielectric constant film can be prevented, and size of the chipping generated by cut can be made small. However, the above-mentioned blade has the large consumption at the time of cutting, and its durability is low. For this reason, jig replacement frequency increases and a manufacturing cost rises.

Then, the cutting method which suppresses peeling and the crack of a low dielectric constant film was examined using the metal-bond blade of longer-life than a resin bonding blade (a metal-bond blade is a cutting blade which combined abrasive particles, such as a diamond, with metal). As a result, in order to suppress peeling and the crack of a low dielectric constant film, it turned out that it is effective for the form of the point of a blade section to be V character form, and to make the particle diameter of an abrasive particle small.

When the wafer surface was cut using the above-mentioned blade, there was a problem that cutting scraps adhered to a blade surface and blinding of a blade occurred by high frequency. A generation of the above-mentioned blinding will reduce the cutting capacity of a blade. There was a problem that the size of the chipping of a cutting plane became large and the quality of a cutting surface deteriorated.

The present invention was made in order to solve the above-mentioned problem, and aims at preventing blinding of a blade, suppressing lowering of cutting capacity, and preventing deterioration of the quality of a cutting surface, when cutting the wafer on which the low dielectric constant film was formed.

The manufacturing method of a semiconductor device according to the present invention is a manufacturing method of a semiconductor device which cuts a substrate with a blade, and comprises a first step of making a portion of a V character-shaped shoulder enter into an inside rather than the substrate front surface and cutting the substrate, using the V character-shaped first blade whose width of a flat surface of a point of a section vertical to a direction of movement is 40% or less of blade width, and whose fineness number of an abrasive particle is more than #3000. The other features of the present invention are explained in detail below.

According to the present invention, when cutting the wafer on which the low dielectric constant film was formed, blinding of a blade can be prevented, lowering of cutting capacity can be suppressed, and deterioration of the quality of a cutting surface can be prevented.

DETAILED DESCRIPTION OF THE PREFERRED EMBODIMENTS

There will now be described about embodiments of this invention with reference to the accompanying drawings. In each drawing, the same reference is given to the same or a corresponding portion, and the explanation is simplified or omitted.

Embodiment 1

The manufacturing method of the semiconductor device of the present invention is explained. Here, the example which cuts the wafer in which elements, such as a transistor, the wiring, and the insulating film were formed on the silicon substrate, in the shape of a semiconductor chip by dicing is explained.

Figure 1:
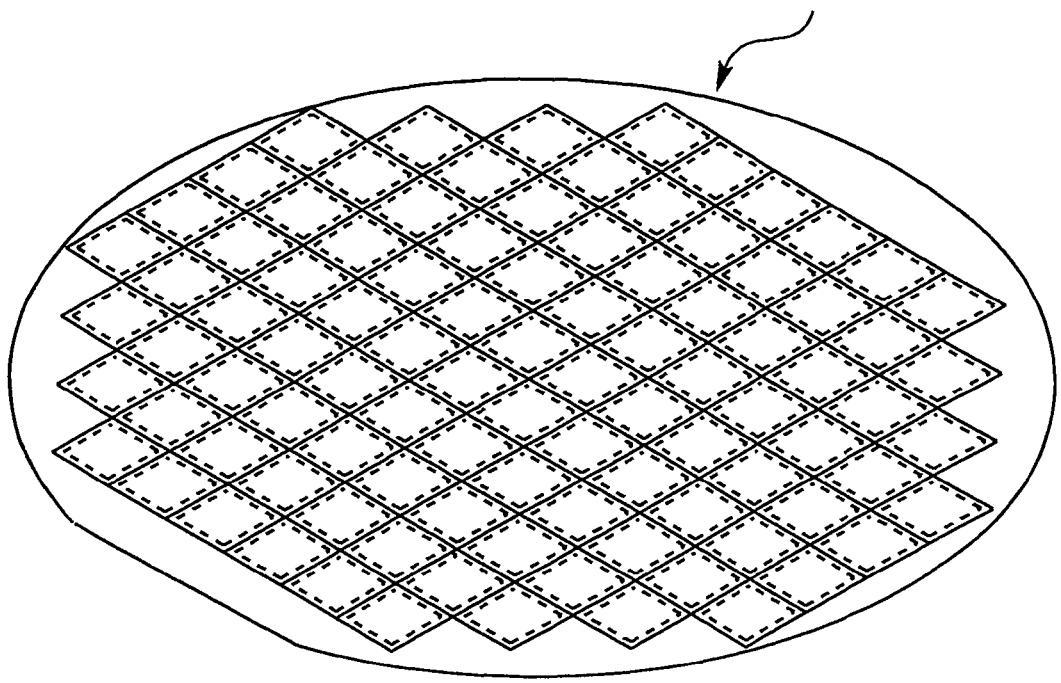
FIG. 1 is a perspective view of the wafer after forming an element etc. on a silicon substrate.
Figure 2:
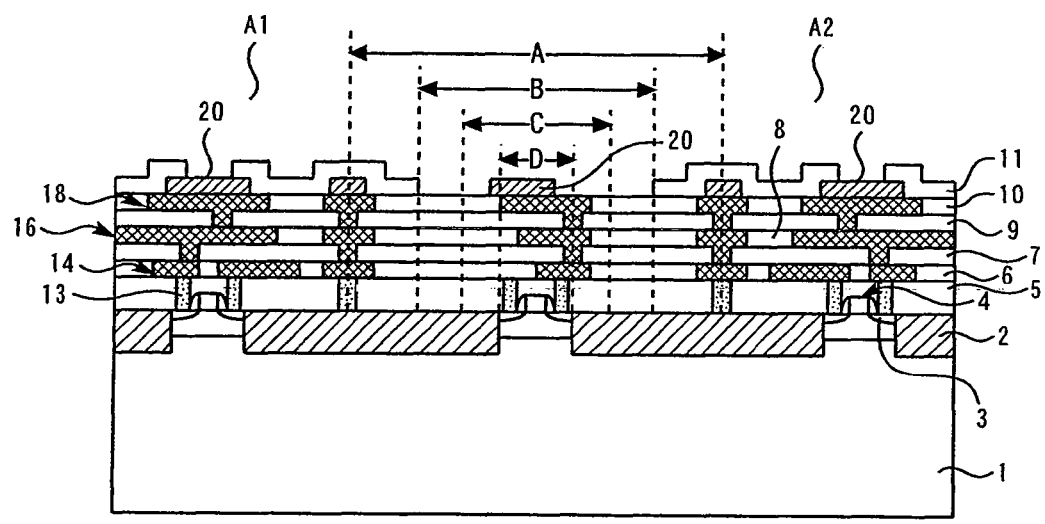
FIG. 2 is a cross-sectional view of the wafer after forming an element etc. on a silicon substrate.

The perspective view of the wafer after forming elements, such as a transistor, a wiring, and an insulating film on a silicon substrate is shown in FIG. 1, and a cross-sectional view is shown in FIG. 2. Back surface polish of the thickness of a wafer is done to the thickness of about 250 µm by the back-grinding step on the back surface of a wafer which is not illustrated. As the method of back surface polish, a mechanical means, a chemical means, the case where a mechanical means and a chemical means are used together, etc. can choose suitably. Device regions A1 and A2 are formed on silicon substrate 1, and these regions adjoin. Between these regions, dicing line A which constitutes a cutting portion of a wafer at a later step is formed. The width of a dicing line in this embodiment is specified as distance A between the guard rings formed between the region in which the bonding pad on a wafer and active elements, such as a transistor, were formed, and an outside region, and has become 180 µm in this embodiment. Passivation film 11 on the front surface of a semiconductor chip includes a silicon nitride film, a polyimide film, etc., and the opening is formed in the dicing region as that it may not be applied to the portion cut by a dicing blade. Width B of the opening of passivation film 11 is 140 µm in this embodiment. A guard ring is formed by laminating the conductor film of the same layer as the wiring in a chip, and it is effective in suppressing to the minimum that moisture trespasses into the inside of the portion which functions as a product via the interlayer insulation film exposed to the semiconductor chip side surface after dicing. The guard ring is arranged so that the region in which the active element which functions as a product was formed may be surrounded along the outside of a chip upper electrode. By making it into the form that a guard ring encloses without a break, invasion of moisture can be prevented more surely. As explained later, the width of the dicing blade used for cutting is 100 µm. On a semiconductor chip main surface, Al wiring 20 used as an electrode in the case of wire bonding or flip chip connection is exposed. At the time of a dicing step, a dicing blade may cause about ±2.5 µm of position drift at the maximum. In such structure, since a guard ring will be damaged when the chipping at the time of a dicing step becomes larger than 40 µm, the intrusion route of moisture to the region which functions as a product is formed, and the reliability of a product falls remarkably. Since the wiring which functions as a product will be damaged when a chipping becomes still larger, the semiconductor chip itself may stop functioning by damage. Then, as for the chipping at the time of a dicing step, after taking manufacture variation etc. into consideration, it is preferred to hold down to below half of the distance from a chip cutting plane to a guard ring. In this embodiment, when a position drift of a dicing blade etc. is taken into consideration and the size of the chipping has become at the maximum below in 15 µm, the reliability of a product is securable.

As shown in FIG. 2, on silicon substrate 1, element isolation 2, a source/drain 3, and gate 4 of the transistor are formed. Insulating films 5-10 are formed on these, and passivation film 11 is formed on it. Insulating films 7 and 9 are low dielectric constant films, such as an SiOC film, and a relative dielectric constant is about 3. Other insulating films are silicon oxide films etc. Copper wirings 14, 16, and 18 are buried in insulating films 6-10. Al wiring 20 is formed on copper wiring 18.

As a low dielectric constant film mentioned above, an SiOF film, an SiLK film, an SiCN film, an $SiO_2$ film containing a methyl group, MSQ (Methyl Silses Quioxane), etc. besides an SiOC film are included. Each of these low dielectric constant films is a film whose relative dielectric constant is lower than $SiO_2$ film (relative dielectric constant about 3.9-4).

Generally as compared with $SiO_2$ film, density of a low dielectric constant film is low, and since it is porosity form and void content is high depending on a membranous kind, its film itself is vulnerable, it is structurally weak, and its adhesive strength of an interface with $SiO_2$ film is weak. For this reason, when the low dielectric constant film is formed on the wafer, and performing dicing, it is easy to generate a crack and a chipping.

In dicing line A, Al wiring 20 of the top layer and copper wirings 14, 16, and 18 of two or more layers connected to the lower layer of Al wiring 20 are formed. Between copper wiring 14 of an undermost layer, and the semiconductor region of a transistor, plug 13 which includes W (tungsten) etc. was formed, and copper wiring 14 of an undermost layer and the semiconductor region formed on the semiconductor substrate are connected mutually. The TEG (Test Element Group) pattern for doing an electric test is formed with these copper wirings 14, 16, and 18, Al wirings 20, and plugs 13.

Figure 3:
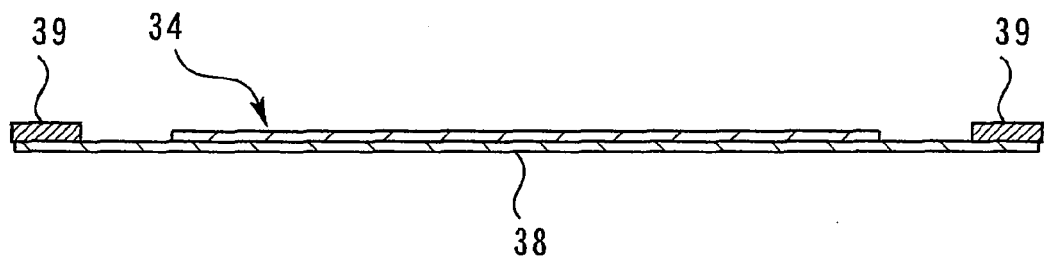
FIG. 3 is the cross-sectional view after sticking a wafer on a dicing tape.
Figure 4:
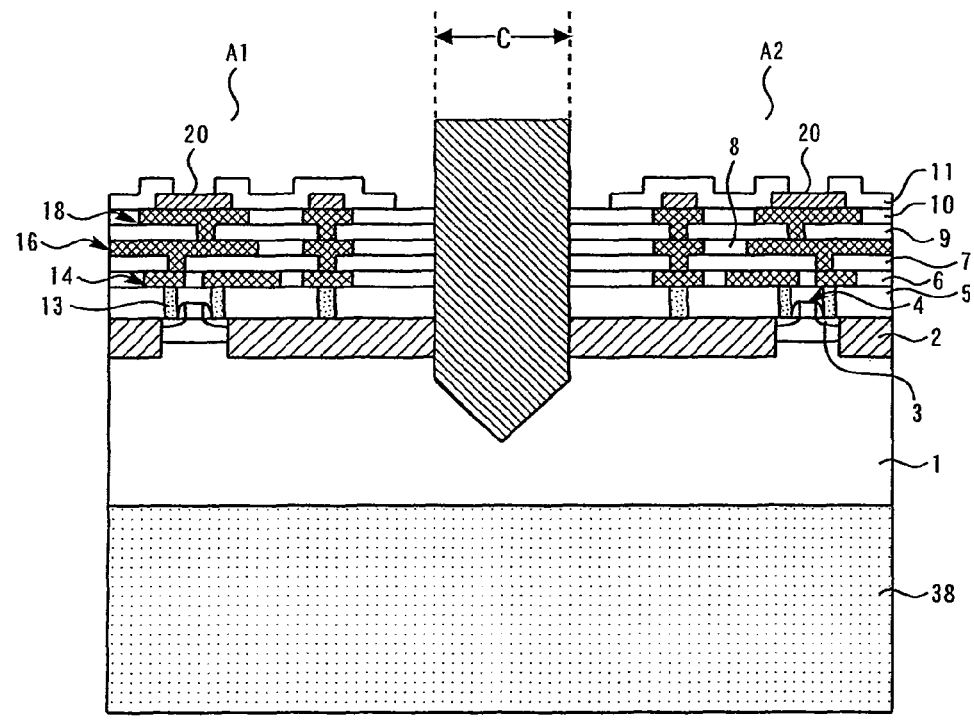
FIG. 4 is a cross-sectional view at the time of cutting the front surface of a wafer.
Figure 5:
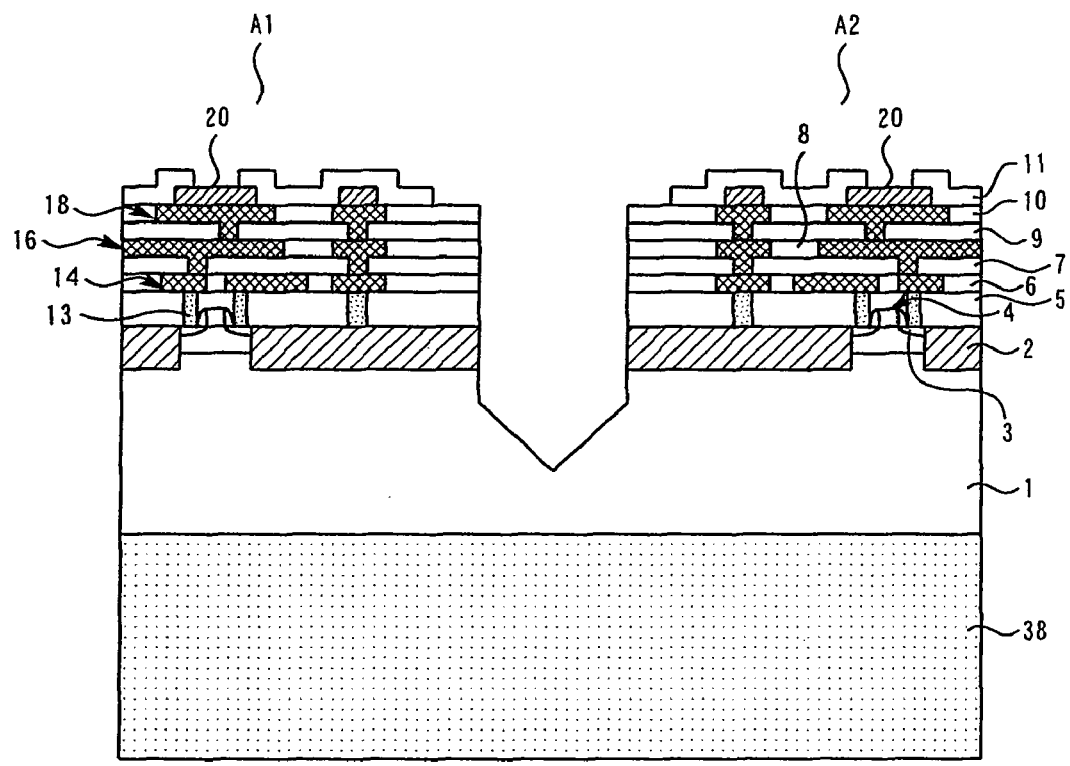
FIG. 5 is a cross-sectional view of the groove formed in the wafer surface.

Next, wafer 34 is stuck on dicing tape 38 as shown in FIG. 3. The circumference of dicing tape 38 is held with metal frame 39. Next, the cross-sectional view at the time of cutting the front surface of the wafer shown in FIG. 1 is shown in FIG. 4. This drawing shows the state where the front surface of dicing line A (refer to FIG. 2) is cut by the metal-bond blade. As a result of being cut by the step of FIG. 4, on the surface of a semiconductor wafer, the trench shown in FIG. 5 is formed along dicing area.

Figure 6:
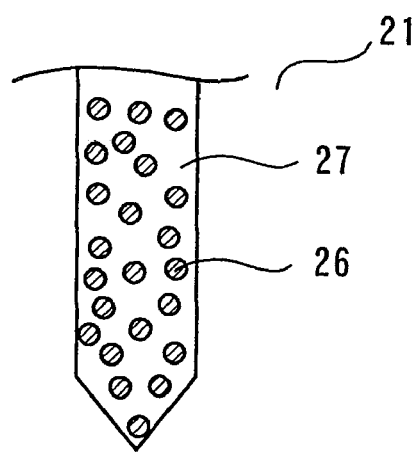
FIG. 6 is a drawing showing the section of the point of a blade.

Here, the above-mentioned metal-bond blade is explained. The metal-bond blade used here is disc-like, and cutting is performed, making it rotate around a central axis and making periphery portion contact to a processed surface. The section near the periphery portion of this blade is shown in FIG. 6. As shown in FIG. 6, the point of metal-bond blade 21 is V character form (a "point" shall refer to the point of a blade section hereafter). This metal-bond blade combines abrasive particles 26, such as a diamond, by using metal 27, such as Ni, as the main bond. As the above-mentioned bond, in order to secure the antiwear quality of a blade, it is preferred to use the material in which resin is not included. In this embodiment, Ni electroforming metal-bond blade which combined diamond abrasive 26 by making into bond material Ni by which electrodeposition manufacture is done with electrolysis plating is used. However, resin may be included in abrasive particle 26.

With the blade which includes an abrasive particle like a metal-bond blade, an abrasive particle contributes to processing. That is, the front surface of a wafer is processed, wearing a bond (metal) and exposing a new abrasive particle in cutting, (cutting edge self-generation). The metal-bond blade has the advantage that consumption of a bond is small and durability is high as compared with the blade which includes resin in a bond in large quantities. For this reason, the jig replacement frequency of a blade can be decreased. Hereby, productivity can be improved and a manufacturing cost can be decreased.

Figure 8:
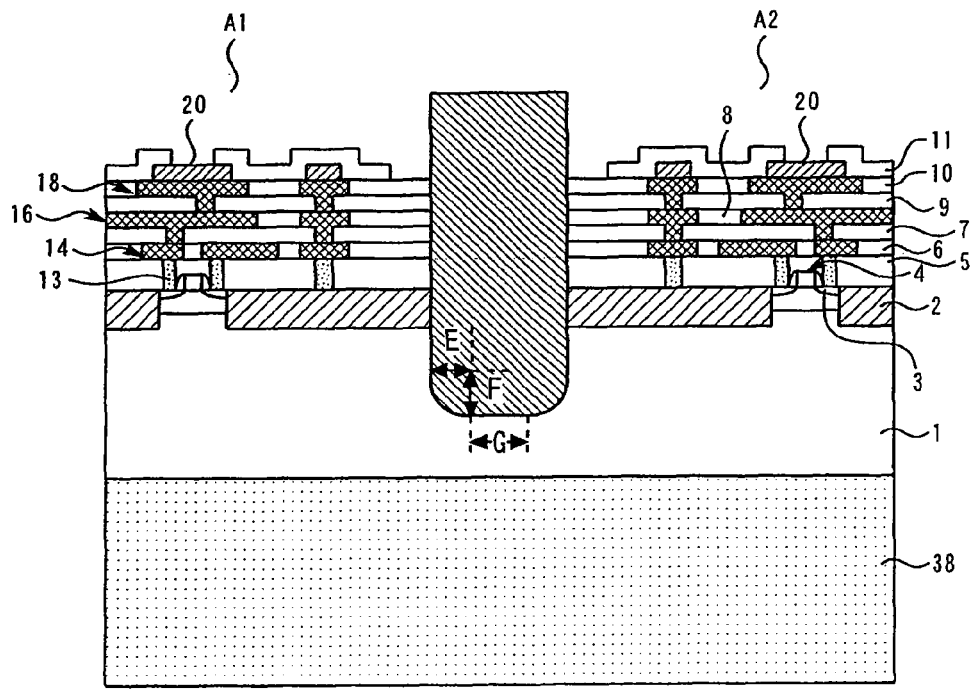
FIG. 8 is a cross-sectional view at the time of cutting the front surface of a wafer.
Figure 9:
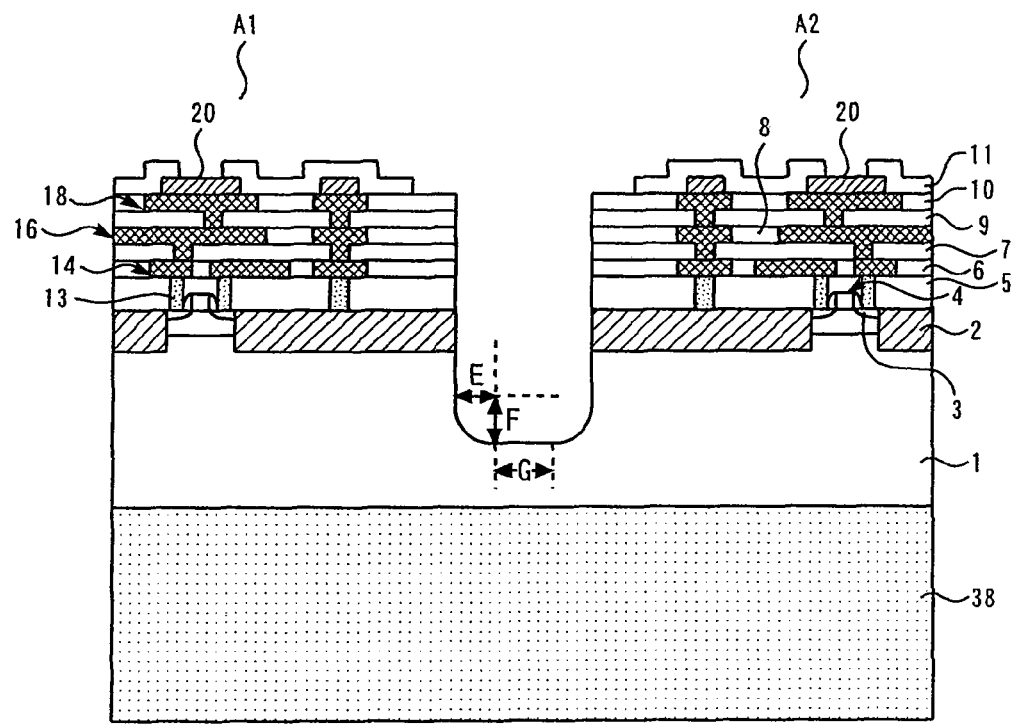
FIG. 9 is a cross-sectional view of the groove formed in the wafer surface.

Here, the definition of the form of the point of a blade is explained with reference to FIG. 7. Width of a blade is set to $W_0$. When it is the form (a) where the point sharpened before blade usage, a point is worn out by cutting and it becomes the form (b) in which the flat surface of $W_1$ in width and the chamfer of curvature $R_1$ were formed. At this time, it is defined as a point being V character form, when satisfying the relation of $W_1 \leq 0.4 W_0$. That is, when the width ($W_1$) of the flat surface of the point of a section vertical to the direction of movement of a blade is 40% or less of blade width ($W_0$), it is defined as the point of a blade being V character form. For example, in $W_0=100$ μm, when it is $W_1 \leq 40$ μm, a point is V character form. That is, as a definition of the blade whose point is V character form, it is the material which includes suitably not only the blade of perfect cutting edge V character form having no flat part in a point and cutting edge semicircle form but the multi-angle form which has 40% or less of flat part to blade width, the form which combined the curved surface and the plane, etc. In addition to the case where a flat surface is formed in a point, there is also the case of becoming a depression surface depending on an abrasion state, but width of the portion which combined the flat surface and the depression surface is set to $W_1$ in this case. About a V character-shaped blade, a point may change to form like FIG. 8, when wear advances by cutting of a semiconductor wafer. As a result of the blade of FIG. 8 cutting, the trench of the form of FIG. 9 is formed in a semiconductor wafer. Even in such a case, when a flat surface, or region G which combined the flat surface and the depression surface is 40% or less of the width of a blade, a good cutting condition will be maintained. Although it does not especially limit about the curved surface area formed in the both sides of a flat surface, it is preferred that the inclination from a flat surface is formed to some extent above. When length F of a point in the portion of distance E which is 30% inside of thickness from the side surface of a blade has a size beyond distance E especially, since the inclination of the surface of curved surface area or a chamfering region is fully secured, a cutting condition is kept comparatively good.

Figure 7:
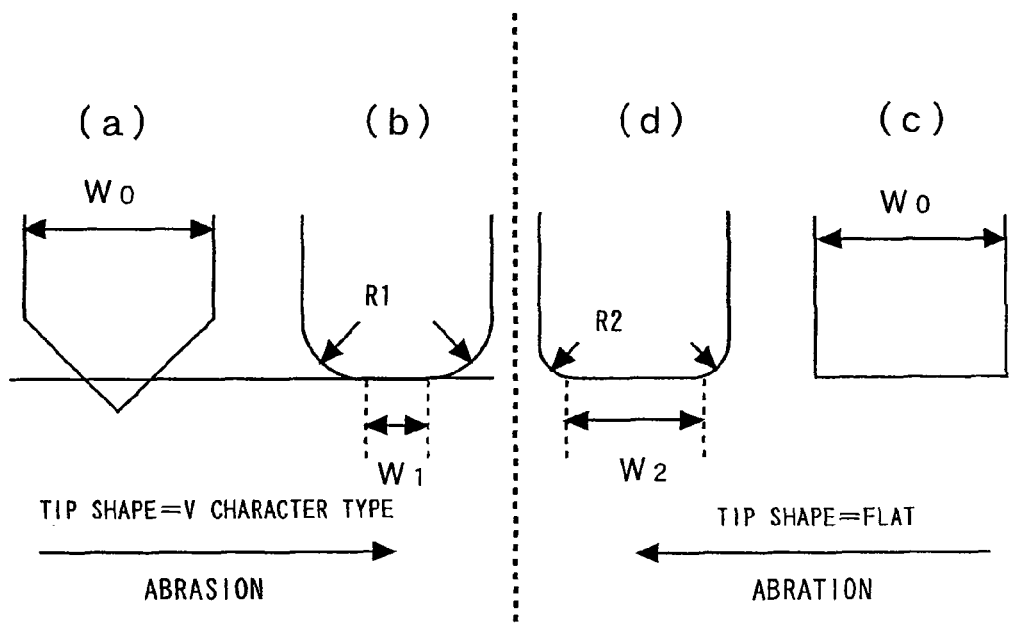
FIG. 7 is a drawing showing the definition of the form of the point of a blade.
Figure 10:
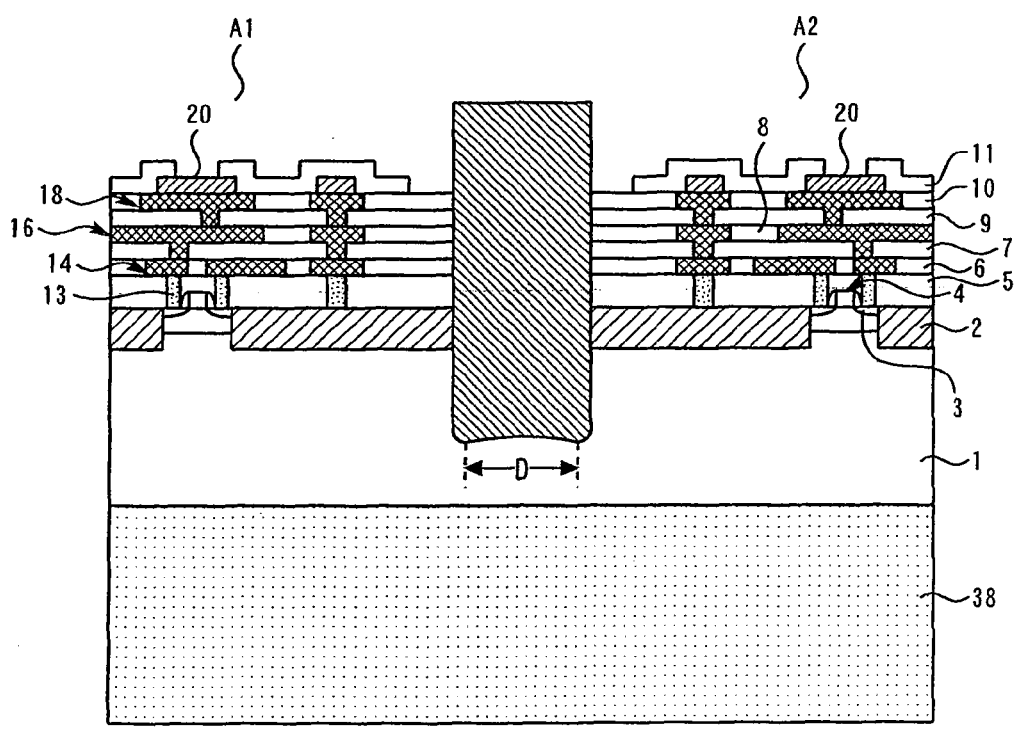
FIG. 10 is a cross-sectional view at the time of cutting the front surface of a wafer.
Figure 11:
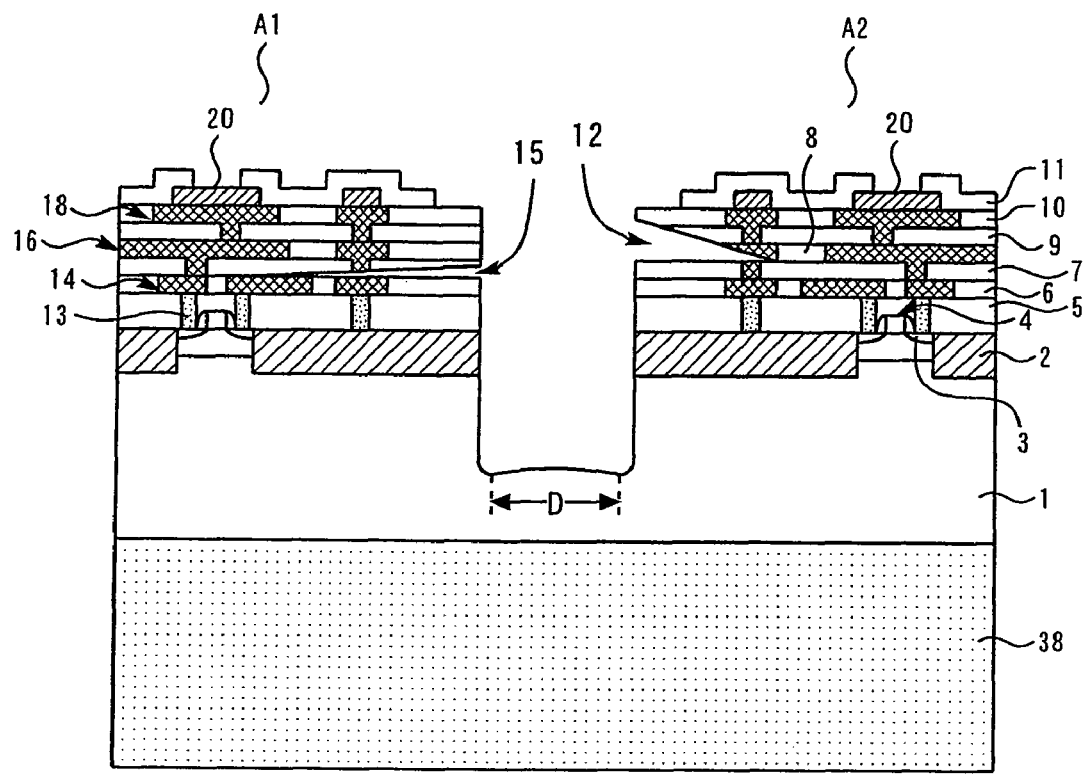
FIG. 11 is a cross-sectional view of the groove formed in the wafer surface.

As shown in FIG. 7, before blade usage, when a point is rectangular form (c), a point is worn out by cutting, and the width of a flat surface is set to $W_2$, and it constitutes form (d) in which the chamfer of curvature $R_2$ was formed. When satisfying the relation of $W_2 > 0.4 W_0$ at this time, it is defined as a point being flat form (it not being V character form). For example, a point is flat form when it is $W_0 = 100$ μm and $W_2 = 60$ μm. About a rectangular blade, a point may change to form like FIG. 10, when wear progresses by cutting of a semiconductor wafer. As a result of the blade of FIG. 10 cutting, the groove of the form of FIG. 11 is formed in a semiconductor wafer. About the blade whose point is a rectangle, although wear progresses, the width of the flat part and recess of a point is still quite big. Since the width of the original flat part is wide about a rectangular blade, it is in the tendency for a recess to be formed in a point as wear progresses. When the semiconductor wafer on which the interlayer insulation film by a low dielectric constant film was formed is cut by the blade of the form in which the width of the region which combined the flat part and recess of the point occupies 40% or more of blade thickness, as shown in FIG. 11, a possibility that chipping 12, peeling 15, etc. on the basis of the interface of a low dielectric constant film will occur becomes high. When the chipping and peeling in a layer of big size occur, it will become the cause of generating the problem that the reliability of a semiconductor device is remarkably spoiled by damage to a guard ring, or the semiconductor device itself becomes not to function by damage to the wiring in a product region.

Figure 12:
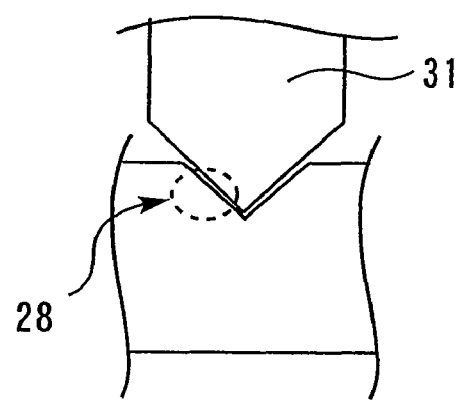
FIG. 12 is a cross-sectional view at the time of cutting a wafer using a V character-shaped blade.

Next, the relation of the form of the point of a blade and workability is explained. When the point of a blade is V character form, the cross-sectional view at the time of cutting a wafer surface is shown in FIG. 12. The front surface of a wafer is cut by the portion of V character form of a blade, and a processing section constitutes V character-shaped groove 28. For this reason, the drainage nature, and the discharge nature of chip powder in groove 28 under cutting are good.

Figure 13:
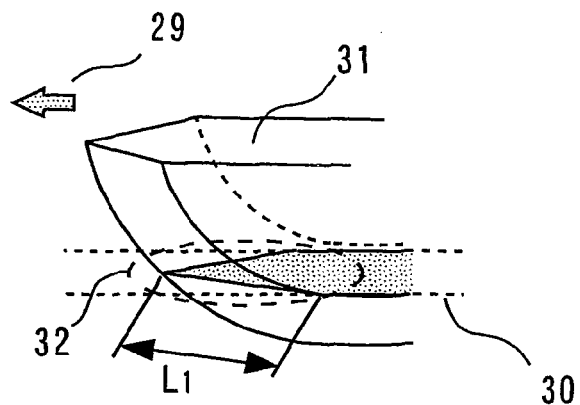
FIG. 13 is a seeing-through perspective view of the blade of FIG. 12.

The seeing-through perspective view of blade 31 of FIG. 12 is shown in FIG. 13. Blade 31 progresses in the direction of arrow 29, rotating around the central axis (not shown), and cuts a wafer surface. Since the point of blade 31 is V character form at this time, leading edge portion 32 of the processing section of a wafer surface constitutes V character form, seeing from the front surface side of a wafer. For this reason, the starting point of the processing section is separated from cutting edge part 30. Therefore, the impact cutting edge part 30 is shocked from blade 31 can be made small.

Figure 14:
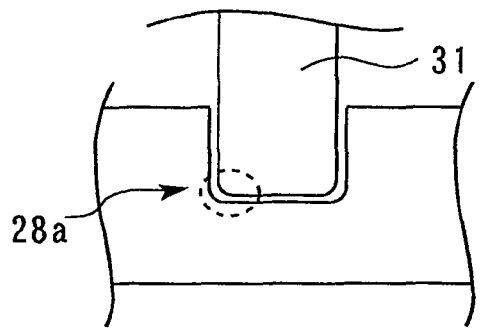
FIG. 14 is a cross-sectional view at the time of cutting a wafer using a flat-shaped blade.

When the point of a blade is flat form, the cross-sectional view of the processing section at the time of cutting a wafer surface is shown in FIG. 14. The section of a processing section constitutes a U character-shaped groove. When a wafer is processed, a cutting scrap collects on groove shoulder part 28a, and is hard to be discharged. For this reason, the drainage nature of a groove and the discharge nature of the chip powder at the time of a cut worsen as compared with the case where a point is V character form.

Figure 15:
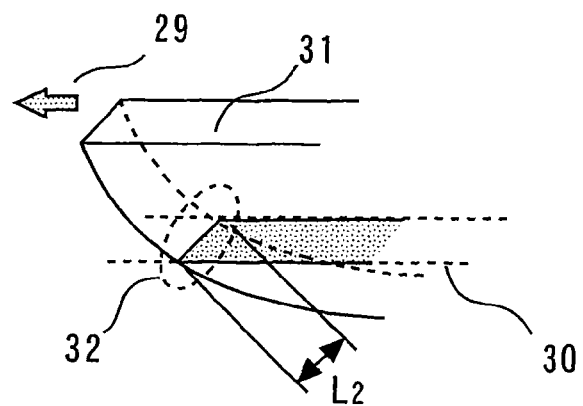
FIG. 15 is a seeing-through perspective view of the blade of FIG. 14.

The seeing-through perspective view of blade 31 of FIG. 14 is shown in FIG. 15. Since the point of blade 31 is flat form, leading edge portion 32 of the processing section of a wafer surface constitutes a line. For this reason, the starting point of a machining part contacts cutting edge part 30. Therefore, the impact cutting edge part 30 is shocked from blade 31 becomes large as compared with the case where a point is V character form.

When the point of a blade is V character form, the length which contributes to processing of leading edge portion 32 is twice as thick as $L_1$, as shown in FIG. 13, and becomes longer than the width of a blade. On the other hand, when the point of a blade is a flat, length $L_2$ which contributes to processing of leading edge portion 32 turns into length equivalent to the width of a blade, as shown in FIG. 5.

For this reason, when the point of a blade is V character form, as compared with the case where it is flat form, the area of the portion which contributes to processing of a blade becomes large. Hereby, the work per abrasive particle which contributes to processing can decrease, and cutting resistance can be made small. Therefore, the size of the chipping generated when processing a wafer can be small suppressed by making the point of a blade into V character form.

Figure 16:
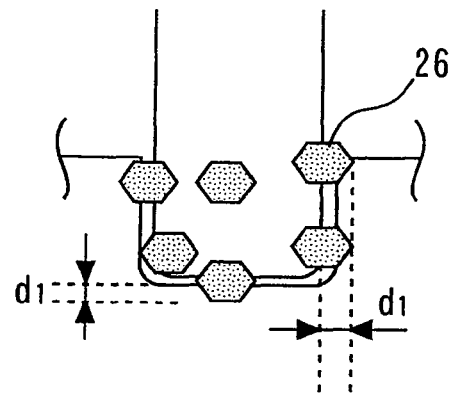
FIG. 16 is a cross-sectional view when the particle diameter of the abrasive particle included in a blade is large.
Figure 17:
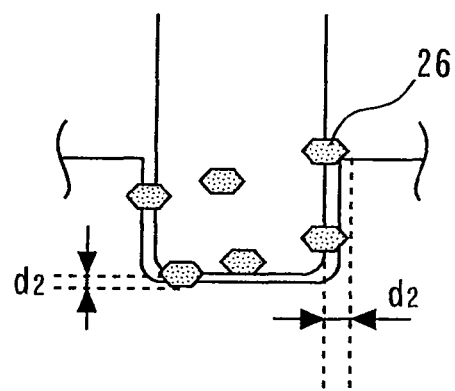
FIG. 17 is a cross-sectional view when the particle diameter of the abrasive particle included in a blade is small.

Next, the relation between the particle diameter of the abrasive particle included in a blade and workability is explained. When the particle diameter of an abrasive particle is $d_1$ and $d_2$ ($d_1 > d_2$), the cross-sectional view of the processing section at the time of cutting the front surface of a wafer is shown in FIG. 16 and FIG. 17, respectively. When a blade rotates and an abrasive particle contacts on the surface of a wafer, the front surface of a wafer is cut. At this time, the impact given to a wafer becomes small in the case of FIG. 17 (particle diameter=$d_2$ of abrasive particle 26) as compared with the case (particle diameter=$d_1$ of abrasive particle 26) of FIG. 16. Therefore, the size of the chipping generated when processing a wafer can be small suppressed by making the particle diameter of an abrasive particle small.

Figure 18:
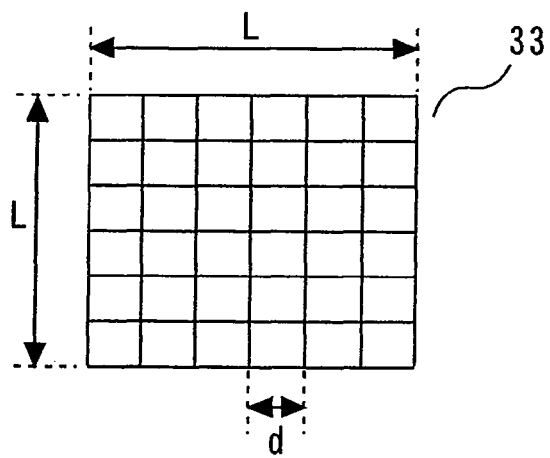
FIG. 18 is a drawing showing the mesh which distributes an abrasive particle.

As for the particle diameter of the abrasive particle mentioned above, it is preferred that a fineness number is a thing more than or equal to #3000 (it is an abrasive particle which can be distributed by meshes 33 shown in FIG. 18 in which the number of the meshes of a net per inch is 3000 or more, and a maximum grain size is smaller as the numerical value of a fineness number is large). When processing a wafer by setting it as the above-mentioned particle diameter using a metal-bond blade, the size of a chipping can be suppressed small.

From above things, when cutting a wafer with a metal-bond blade, in order to suppress small the chipping generated in the cutting plane of a wafer, it is preferred to use the metal-bond blade whose particle diameter of an abrasive particle is small (more than fineness number #3000), and whose point of blade is V character form.

As mentioned above, when cutting as shown in FIG. 12 using metal-bond blade whose point is V character form, the discharge nature of the chip powder in groove 28 is good. Therefore, the cutting resistance at the time of processing is low, and the cutting edge self-generation of a blade cannot occur easily. When the particle diameter of an abrasive particle is made small, the particle diameter of an abrasive particle will become a size equivalent to a cutting scrap, and a cutting scrap will be easily got blocked between adjoining abrasive particles. That is, it becomes easy to generate blinding. Particularly, when performing processing as shown in FIG. 12 using the metal-bond blade which includes the abrasive particle whose fineness number is more than or equal to #3000, and whose point is V character form, the generation of blinding of an abrasive particle becomes remarkable.

Since the substance which is easy to do blinding is generally included in the low dielectric constant film when cutting a low dielectric constant film, it becomes easy to generate blinding. Copper wiring exists in the TEG pattern of dicing line A shown in FIG. 2. Since ductility and malleability are high, copper causes blinding easily.

In order to suppress the above-mentioned blinding, in this embodiment, it was made to make the slitting depth of the blade from a wafer surface to an inside deeper than the portion of a V character-shaped shoulder using the metal-bond blade which includes the abrasive particle whose fineness number is more than or equal to #3000, and whose point is V character form. Hereafter, the method is explained.

Figure 19:
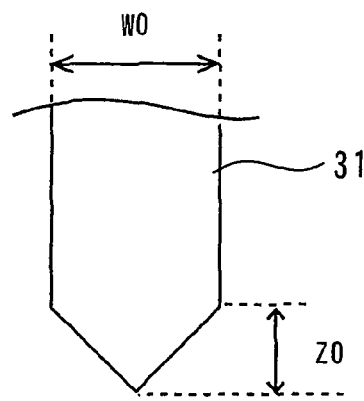
FIG. 19 is a drawing showing the point of a V character-shaped blade.
Figure 20:
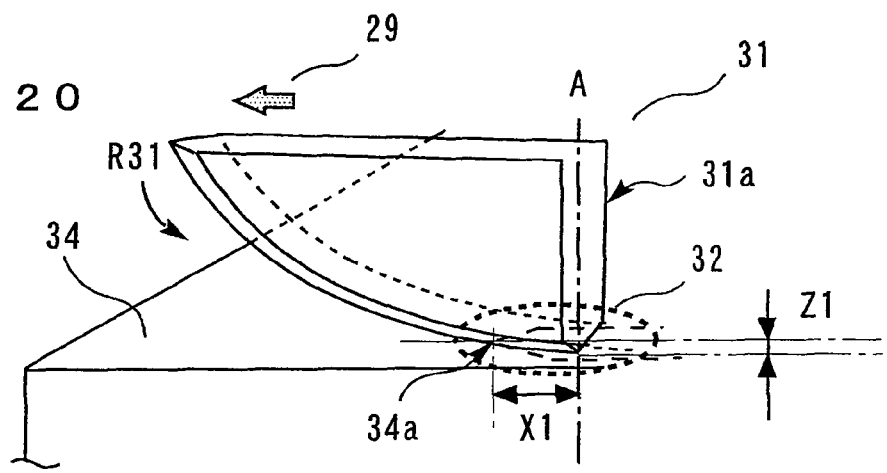
FIG. 20 is a seeing-through perspective view of a blade when slitting to a wafer is shallow.

Here, as shown in FIG. 19, width of an above-mentioned V character-shaped blade (first blade) is set to $W_0$, and the depth from the shoulder to a point of V character of a blade is set to $Z_0$. When cutting a wafer surface, the perspective view at the time of making the slitting depth of the blade to a wafer surface shallower than $Z_0$ is shown in FIG. 20. The perspective view at the time of making the above-mentioned slitting depth deeper than $Z_0$ is shown in FIG. 21.

As shown in FIG. 20, blade 31 advances to the direction of 29, setting the slitting depth of the blade to the front surface of wafer 34 to $Z_1$ ($Z_1 < Z_0$), and rotating to the direction of R31. When it sees from the upper surface side of wafer 34, the groove spreads out in the shape of a V character in the opposite direction of the direction of movement 29 of the blade by making 34a into the peak. When the intersection of straight line A which passes through the central axis of blade 31, and a processed surface is made into an origin at this time, cutting will be performed in 0–$X_1$ toward direction of movement 29.

Figure 21:
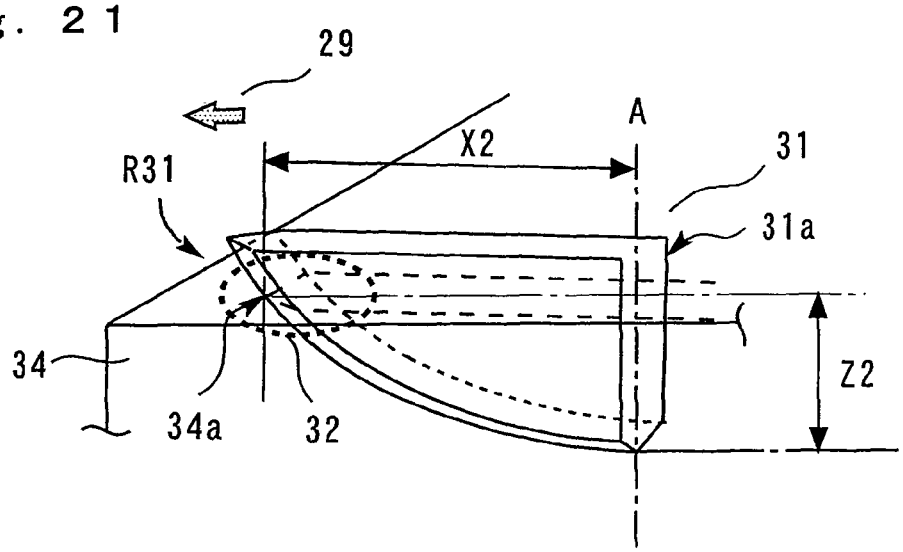
FIG. 21 is a seeing-through perspective view of a blade when slitting to a wafer is deep.

As shown in FIG. 21, blade 31 advances to the direction of 29, setting the slitting depth of the blade to wafer 34 front surface to $Z_2$ ($Z_2 > Z_0$), and rotating to the direction of R31. When it sees from the upper surface of wafer 34, the groove spreads out in the shape of a V character in the opposite direction to the direction of movement 29 of the blade, making 34a into the peak. This groove of the shape of V character continues to the opposite direction to the direction of movement of the blade with width $W_0$ of the blade. At this time, cutting is performed in 0–$X_2$ toward direction of movement 29. The range where this cutting is performed increases as the slitting depth to wafer 34 front surface becomes deep. Here, it is $X_1 < X_2$ from the relation of $Z_1 < Z_0 < Z_2$. That is, it was made to make the range which blade 31 cuts increase to 0–$X_2$ from 0–$X_1$, making the slitting depth of blade 31 deep from $Z_1$ to $Z_2$, and making the portion of a V character-shaped shoulder enter into the inside rather than the front surface of wafer 34.

Figure 22:
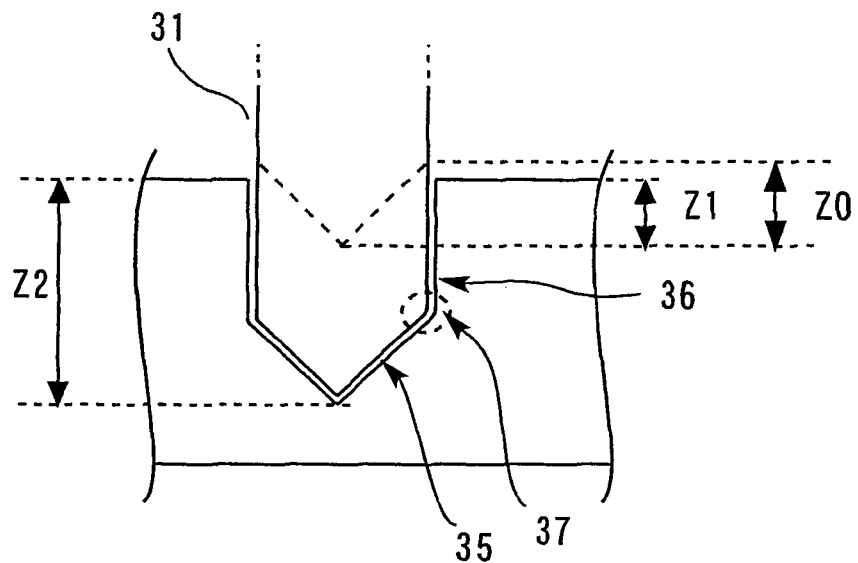
FIG. 22 is a cross-sectional view of FIG. 20 and FIG. 21.

The section of the wafer of a direction which passes along straight line A of FIG. 20 and FIG. 21, and is vertical to the direction of movement of a blade is shown in FIG. 22. By making the slitting depth to a wafer surface of blade 31 deep from $Z_1$ to $Z_2$, the section form of a groove turns into form which has V character groove 35, side surface 36 vertical on the surface of a wafer, and shoulder 37 that connects these.

Cutting scrap can be made easy to stop at shoulder 37 at the time of cutting, and cutting resistance can be made to increase than the case of FIG. 20 by making the section of a groove into the above-mentioned form. A cutting edge self-generation can be promoted by this, and the generation of blinding can be suppressed. Although the exclusion action over a cutting scrap is large in the interface of the chamfer and curved surface part of the leading edge portion of a blade, and the bottom of a cut groove, in the interface of the side surface of a blade, and the side surface of a cut groove, the exclusion action over a cutting scrap becomes comparatively small. Therefore, the cutting scrap generated by cut stops at the bottom of V character groove 35 sufficiently. When a cutting scrap stops in a groove, the cutting resistance to the portion which contributes to processing of a blade, i.e., in this embodiment, to the V character-shaped point of a blade increases. Therefore, even when a metal-bond blade which includes the abrasive particle whose fineness number is more than or equal to #3000, and whose point is V character form is used, a cutting edge self-generation can be promoted and the generation of blinding can be suppressed.

Next, the example which cuts the wafer (thickness about 250 µm) shown in FIG. 2 by two steps of cutting is explained. For example, the front surface of a wafer is cut using metal-bond blade 21 (first blade) shown in FIG. 6 by doing the depth of $Z_2$ shown in FIG. 21 to more than or equal to 200 µm. The groove formed of this cutting is kept from penetrating a wafer at this time. That is, half cutting which forms a groove on the surface of a wafer is performed.

The fineness number of an abrasive particle is made into #3000~3500, using a nickel electroforming blade (metal-bond blade) as the above-mentioned first blade. Width of a blade is made into about 70~110 µm, rotational speed of a blade is made into about 30000~35000 rpm, the speed of advance of a blade is made into about 50 mm/sec, and cutting is performed by contacting the point of a blade at the angle of 90 degrees on the surface of a wafer.

The result of having performed the grinding process of the wafer surface by having made into the following condition slitting depth $Z_2$, the fineness number, and point form which were mentioned above, and having evaluated the size of the generated chipping is shown in Table 1. The size of a chipping is defined as the average size of the chip generated from the machined end, and the portion (chipping) from which the surface film separated, when the wafer after cutting is seen from the upper surface. As chipping size is small, it is good and it is more preferred that it is less than 10 µm.

TABLE 1

| SAMPLE No. | DEPTH $Z_2$ | FINENESS NUMBER # | POINT FORM | CHIPPING | REMARK |
|---|---|---|---|---|---|
| 1 | 100 µm | #2000 | flat | 15 µm | 45000~50000 rpm, 50 mm/sec |
| 2 | 100 µm | #3000~3500 | flat | 10 µm | |
| 3 | 100 µm | #2000 | V Character | 8 µm | |
| 4 | 100 µm | #3000~3500 | V Character | 5 µm | A chipping is enlarged by blinding under processing (initial 5 µm → 100 µm) |
| 5 (present invention) | 200 µm | #3000~3500 | V Character | 5 µm | Regardless of blade width, there is blinding suppression effect. |

When samples 1 and 2 of Table 1 are compared, it turns out that chipping size tends to become small when it cuts by setting depth $Z_2$ to 100 µm with the point of a blade being flat form, and the fineness number of an abrasive particle is enlarged (the particle diameter of an abrasive particle is made small). The comparison of samples 3 and 4 shows that the size of a chipping will become small when it cuts by setting depth $Z_2$ as 100 µm with the point of a blade being V character form, and the fineness number of an abrasive particle is enlarged. Therefore, chipping size can be made small by what the fineness number of an abrasive particle is enlarged for (the particle diameter of an abrasive particle is made small). A big chipping not only may occur, but in a blade with a small fineness number, and a blade whose leading edge is flat-shaped, interfacial peeling several times as large as the size of a chipping may advance toward the inside of a chip from the portion which the chipping generated with the interface of a low dielectric constant film as the starting point.

When samples 1 and 3 of Table 1 are compared, it turns out that chipping size tends to become small by making the point of a blade into V character form from flat form when depth $Z_2$ is set to 100 µm, the fineness number of an abrasive particle is set to #2000 and it cuts. The comparison of samples 2 and 4 shows that chipping size tends to become small by making the point of a blade into V character form from flat form also when depth $Z_2$ is 100 µm and the fineness number of an abrasive particle is #3000-3500. Therefore, chipping size can be made small by making tip shape of a blade into V character type from a flat.

In samples 1-4 of Table 1, the chipping in the cutting early stages of sample 4 which set the fineness number of the abrasive particle to #3000-3500, and made the point of the blade V character form is the smallest. However, with sample 4, there is the tendency for blinding to occur in cutting and for chipping size to become large gradually. For example, there is a case that, although a chipping in the early stages of cutting was 5 µm, by cutting a wafer 30 cm in diameter once, blinding advances in the second half of cutting and the size of a chipping may be enlarged even more than 100 µm. On the other hand, as for sample 5 (present invention) with which the fineness number of an abrasive particle and the form of the point were the same as sample 4 and with which they made depth $Z_2$ deep at 200 µm, it turned out that enlargement of the chipping due to cutting performance degradation can be effectively suppressed since size of the chipping in the early stages of cutting can be equally made small with sample 4 and the generation of blinding under cutting can be suppressed effectively. It turned out that it is not based on blade width (70-110 µm), but the blinding effect can be inhibited. In sample 5, a chipping, and interfacial peeling of a low dielectric constant film can be made sufficiently small. The chipping and interfacial peeling in sample 5 were suppressed at the maximum at below half of the distance of a cutting plane and a guard ring, and below further more desirable 15 µm.

It is thought that the above-mentioned blinding suppression effect was acquired when the cutting resistance under processing increased by cutting by making depth $Z_2$ deep to 200 µm, and making the portion of a V character-shaped shoulder enter into the inside rather than the front surface of wafer 34. With the above-mentioned cutting method, the size of a chipping can be suppressed small, suppressing the temporal enlargement of a chipping by blinding.

The leading edge portion of the processing section seen from the wafer surface side constitutes V character form like the case where it is shown in FIG. 13. For this reason, the starting point of the processing section is separated from the cutting edge part. Hereby, the impact the cutting edge part of a wafer is shocked from a blade can be made small. Therefore, the advantage that the point is V character form, and an advantage with small (more than or equal to fineness number #3000) particle diameter of an abrasive particle can be reconciled.

Figure 23:
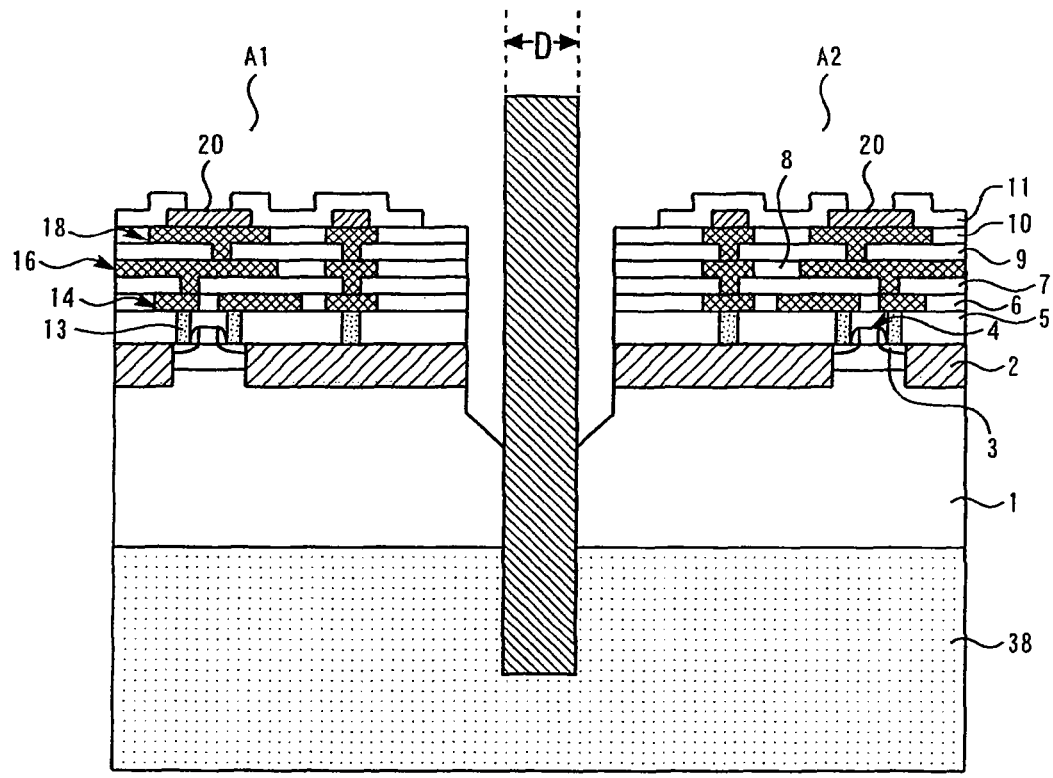
FIG. 23 is a cross-sectional view at the time of doing full cutting of the wafer.
Figure 24:
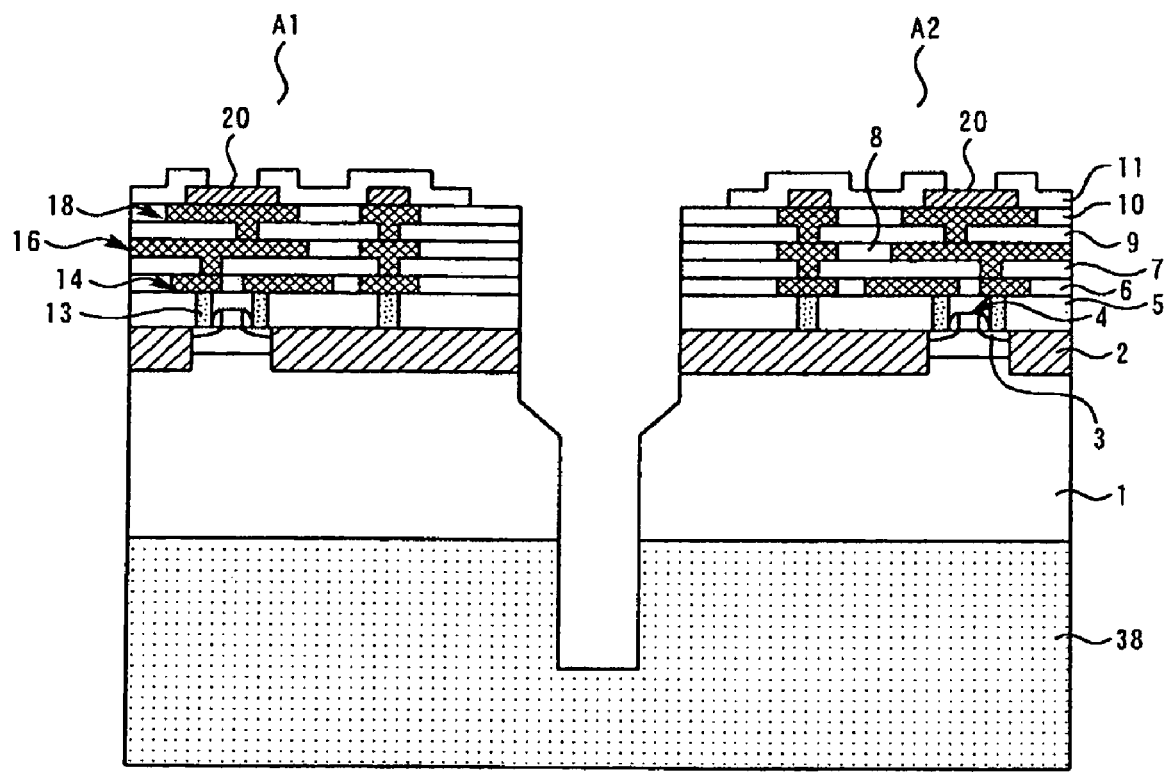
FIG. 24 is the cross-sectional view after doing full cutting of the wafer.

Then, the bottom of the groove formed by the above-mentioned half cutting is cut with the blade whose width D is 30-40 µm, and the step which makes a groove penetrate the back surface of silicon substrate 1 (full cutting) is performed as shown in FIG. 23. By the cutting step shown in FIG. 23, as shown in FIG. 24, the whole semiconductor wafer is cut and a part of dicing tape 38 is cut. In the half cutting mentioned above, the first blade which has an abrasive particle more than or equal to fineness number #3000 was used. On the other hand, as for the fineness number of the abrasive particle of a blade (second blade) used for full cutting, it is preferred to use a fineness number, for example, #2000 (abrasive particle which can be distributed by the mesh whose opening d shown in FIG. 18 is about 6 μm), smaller than the abrasive particle of a blade (first blade) used for half cutting.

By using the abrasive particle of the above-mentioned fineness number, a cutting speed can be easily improved as compared with the case where an abrasive particle with a large fineness number is used. Damage to dicing tape 38 stuck on the back surface of silicon substrate 1 of FIG. 23 by frictional heat can be suppressed.

As for the width of a second blade, in the step of the above-mentioned full cutting, it is preferred to use a blade smaller than the width of the first blade used at the half cutting step. Hereby, full cutting can be performed, without contacting a second blade on the surface of a wafer. Therefore, the generation of the chipping by full cutting can be suppressed.

As for a second blade, in the step of the above-mentioned full cutting, it is preferred to use a blade with larger blade width than the width (width of $W_1$ shown by FIG. 7) of the flat surface of the point of a first blade. Hereby, when performing full cutting, it can cut by contacting the point of a second blade on the slope of V character form formed by half cutting. Hereby, when performing full cutting, the stress which a second blade gives to a wafer can be eased. Therefore, the generation of the crack and chip of a silicon substrate by full cutting can be suppressed.

In this embodiment, two steps of cuts which do full cutting after doing half cutting of the wafer were made to perform dicing of the wafer. Hereby, in the stage of half cutting, cutting which suppressed blinding of the blade, prevented lowering of cutting capacity, and suppressed the size of the chipping small can be performed. In the stage of full cutting, a cutting speed can be enlarged at a processing object excluding a low dielectric constant film and a TEG pattern. When performing half cutting and full cutting simultaneously, cutting with the same cutting speed is also possible.

As shown in FIG. 2, the low dielectric constant film is formed on silicon substrate 1. In the region of dicing line A, TEG exists and copper wiring is embedded. Although it is easy to become a cause of blinding under cutting, such low dielectric constant films and copper wiring are removed when grinding a wafer surface. Even if it is such a case, the generation of blinding can be effectively suppressed by using the grinding method shown by this embodiment.

As explained above, in this embodiment, the wafer surface was cut, using the metal-bond blade which includes the abrasive particle whose fineness number is more than or equal to #3000, and whose point is V character form, and making the slitting depth of the blade from a wafer surface to an inside deeper than the portion of a V character-shaped shoulder. Hereby, the cutting resistance at the time of cutting can be made to increase. Therefore, the generation of blinding at the time of cutting on a wafer can be suppressed, and lowering of cutting capacity can be prevented. The chipping size generated at the time of dicing can be suppressed small, and deterioration of the quality of a cutting surface can be prevented.

This embodiment explained the example which processes the wafer in which the low dielectric constant film was formed on the silicon substrate. However, the applied object of the present invention is not restricted when cutting the above-mentioned wafer, but also when cutting the wafer for SOI (Silicon On Insulator) etc., it can be applied. Although this embodiment described the case where the thickness of a semiconductor wafer was 250 μm, it is not the material restricted to this and, also in the case of a still thinner semiconductor wafer, it can be applied. For example, when the thickness of a semiconductor wafer is less than 100 μm, and cutting with a metal-bond blade whose point is V character form and the thickness of the uncut portion part of a semiconductor wafer becomes small too much, the problem by a semiconductor wafer breaking in cutting may occur. Therefore, when the thickness of a semiconductor wafer becomes below 100 μm, when cutting a semiconductor wafer with the metal-bond blade whose point is V character form, it is preferred to cut off partially leaving at least ⅓ or more of the thickness of a wafer, more desirably more than half of the thickness of a semiconductor wafer. In such a case, the slitting depth with the blade whose leading edge is V character form becomes very shallow. So, in order to fully secure slitting to the side surface portion of a leading edge V character blade, it is necessary to shorten length for the point used as V character. In such a case, it is preferred to use the blade whose thickness is ⅔ or less, more desirably half or less of the thickness of a semiconductor wafer. For example, when cutting the semiconductor wafer of the thickness of 100 μm, by using the material with which the thickness of a blade is 50 μm, and the length of a V character-shaped leading edge portion is 25 μm, and cutting by slitting depth 50 μm, a good cutting condition is securable, preventing the crack of the semiconductor wafer in the middle of cutting.

Embodiment 2

This embodiment explains the step until it performs the assembly of a semiconductor chip and results in shipment after performing the dicing step shown by Embodiment 1.

Figure 25:
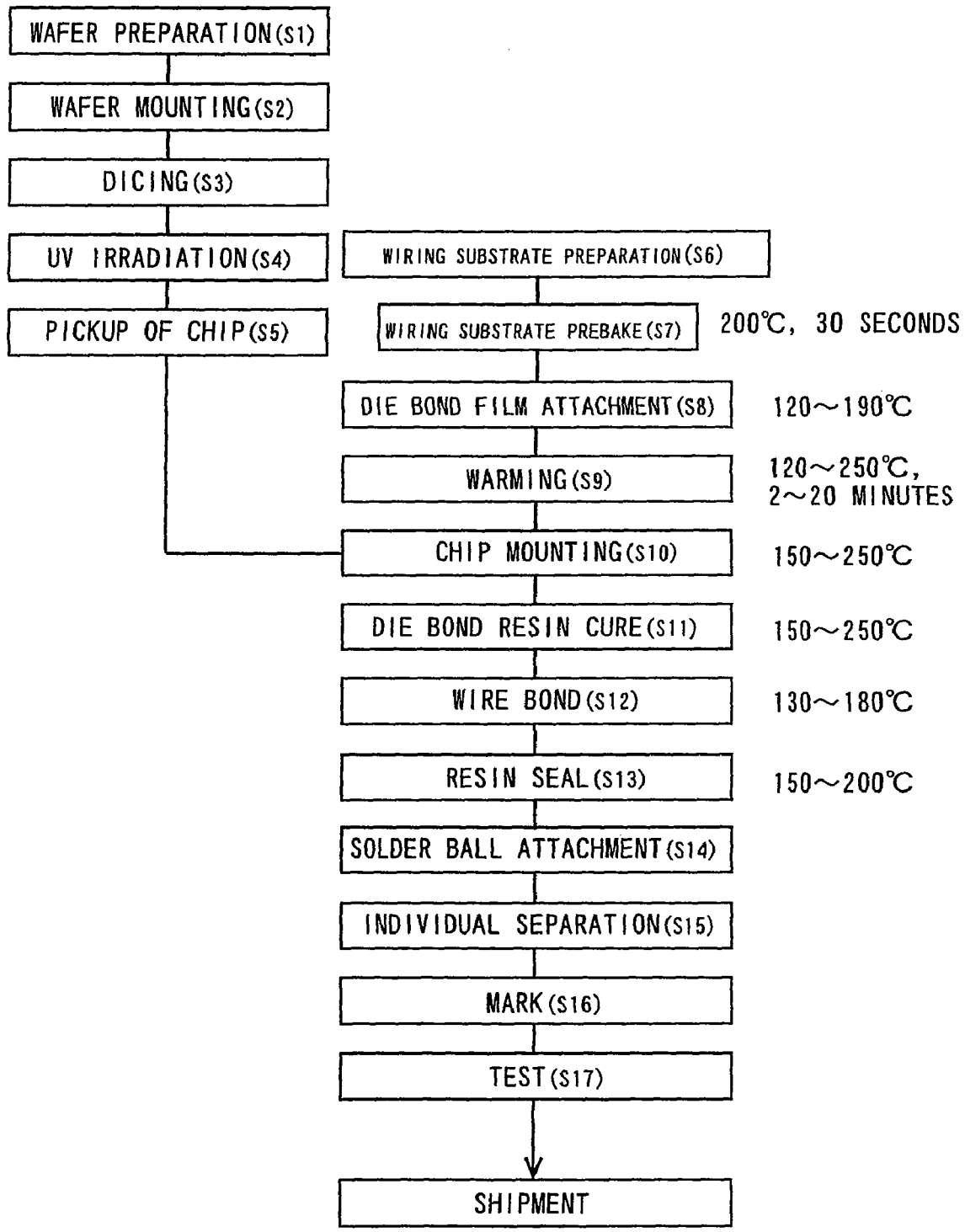
FIG. 25 is a process flow picture until it performs shipment from a dicing step.
Figure 26:
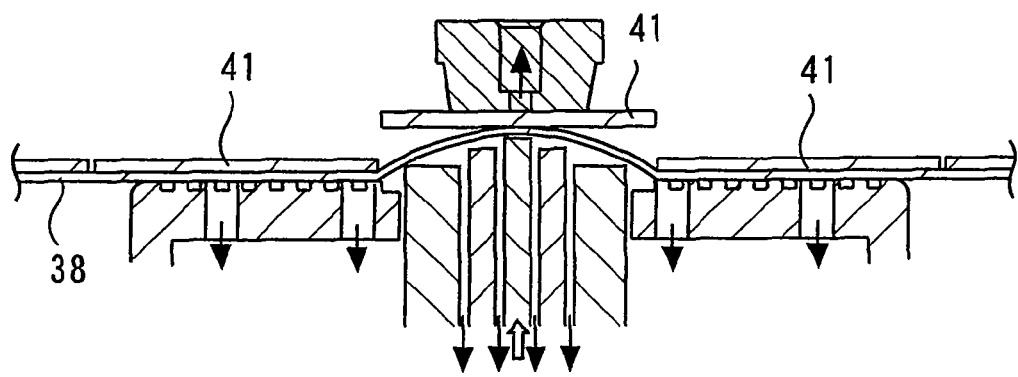
FIG. 26 is a cross-sectional view at the time of peeling a dicing tape.

The process flow comprising the dicing step shown by Embodiment 1, and steps until it ships after that is shown in FIG. 25. First, wafer 34 in which elements, such as a transistor, were formed on the silicon substrate is prepared as described in FIG. 1 (S1). Next, like the description to FIG. 3, dicing tape 38 is stuck on the back surface of wafer 34, and it mounts (S2). Next, dicing is performed by the method shown by Embodiment 1 (S3). Next, ultraviolet rays are irradiated in order to reduce the adhesive power of dicing tape 38 (S4). Hereby, peeling of dicing tape 38 in a later step can be made easy. Next, like the description to FIG. 26, dicing tape 38 is peeled and semiconductor chip 41 cut per chip is picked up (S5).

Figure 27:
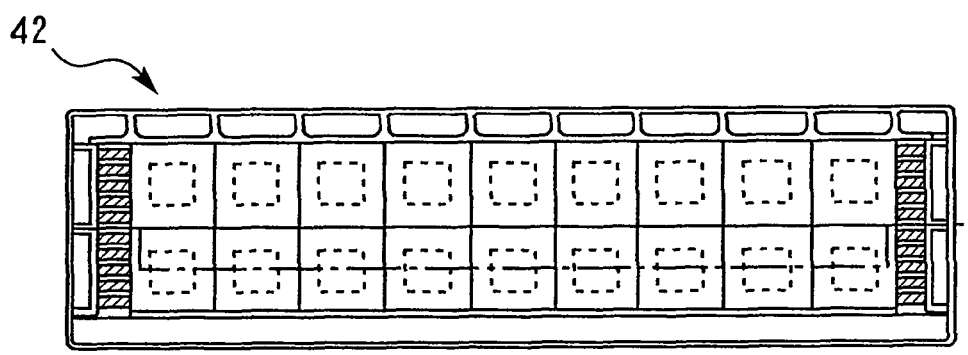
FIG. 27 is a plan view of a wiring substrate.
Figure 28:
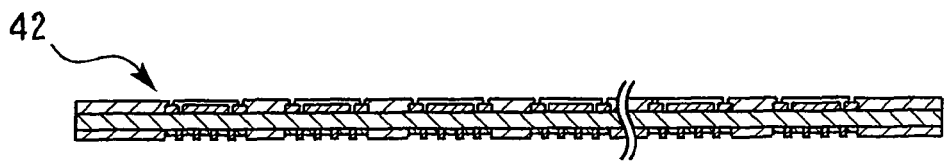
FIG. 28 is a cross-sectional view of a wiring substrate.

In order to assemble semiconductor chip 41 picked up by above S5, like a description to FIG. 27 (plan view) and FIG. 28 (cross-sectional view), wiring substrate 42 formed with organic resin, such as epoxy system resin is prepared (S6). Next, prebake which heat-treats wiring substrate 42 about 30 seconds at the temperature of 200° C., reduces moisture absorption, and removes the solvent which remains is performed (S7).

Figure 29:
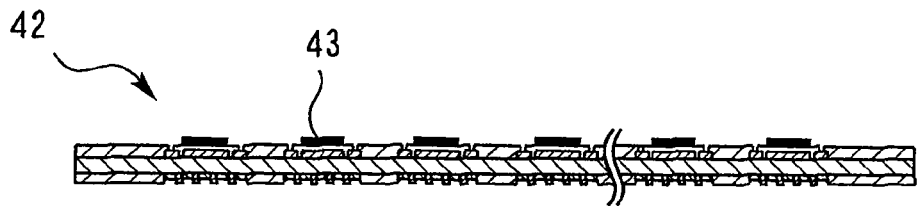
FIG. 29 is the cross-sectional view after sticking a die bond film on a wiring substrate.

Next, die bond film 43 is stuck at the temperature of 120-190° C. like a description to FIG. 29 on wiring substrate 42 which performed prebake by S7 (S8). Next, this film is heat-treated about 2 to 20 minutes at the temperature of 120-250° C. (S9), and hardening contraction of a die bond film is promoted. Hereby, when a void occurs between the front surface of wiring substrate 42, and die bond film 43, a void can be extruded and a void can be reduced.

Figure 30:
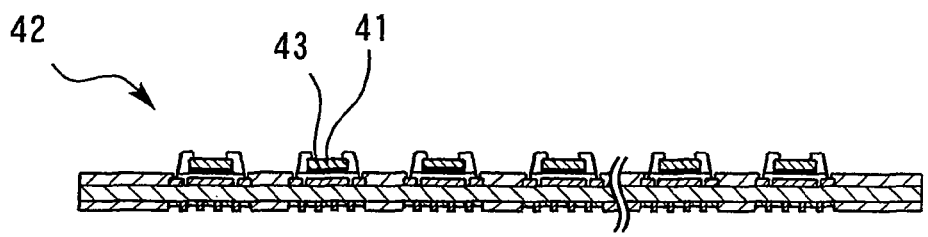
FIG. 30 is the cross-sectional view after doing the wire bond of the semiconductor chip on a wiring substrate.
Figure 31:
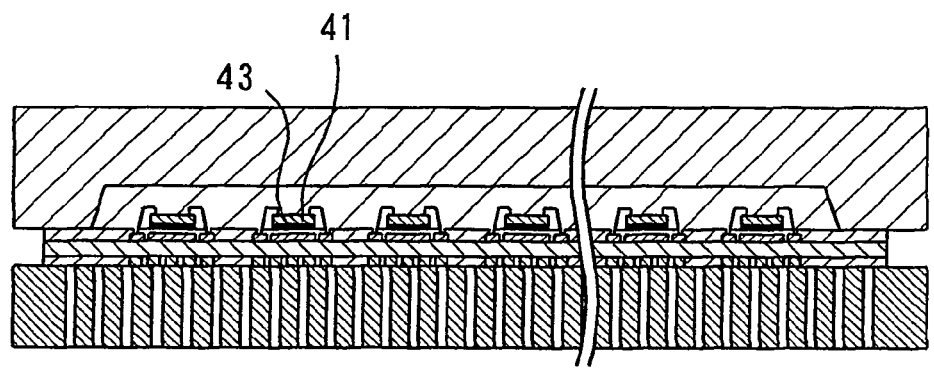
FIG. 31 is the cross-sectional view after doing the sealing resin of the semiconductor chip.

Next, the semiconductor chip picked up by S5 is mounted on die bond film 43 (S10). At this time, the heat about 150-250° C. is applied to semiconductor chip 41. Next, the cure of the resin for performing a die bond is done at the temperature of 150-250° C. (S11). Next, a wire bond is performed like the description to FIG. 30 (S12). At this time, the temperature of about 130-180° C. is applied to a semiconductor chip. Next, a resin seal is performed like the description to FIG. 31 (S13). At this time, the temperature of about 150-200° C. is applied to semiconductor chip 41.

Figure 32:
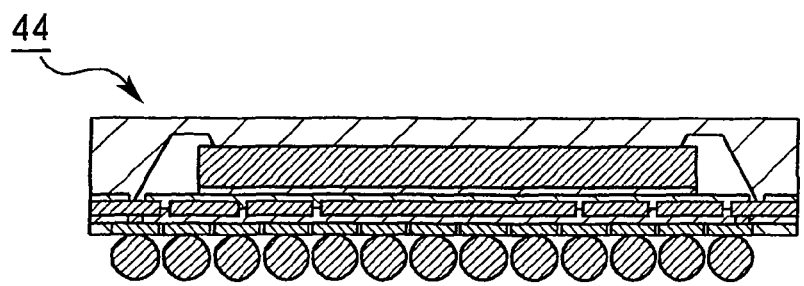
FIG. 32 is a cross-sectional view of the completed semiconductor device.

Next, the solder ball used as an external terminal is formed on the electrode of the back surface of wiring substrate 42 (S14), individual separation (S15) of the semiconductor chip is done, and passing a mark (S16) and the last test (S17), semiconductor device 44 completed like the description to FIG. 32 is shipped.

What is claimed is:

1. A method of manufacturing a semiconductor device, said method comprising the steps of:
   a) preparing a wiring board having a top surface and a bottom surface opposite to said top surface, said wiring board having a plurality of mounting areas on said top surface for boarding a plurality of semiconductor chips;
   b) mounting a plurality of semiconductor chips on said plurality of mounting areas on said top surface of said wiring board;
   c) connecting said plurality of semiconductor chips and said wiring board by a plurality of connecting wires;
   d) sealing said plurality of semiconductor chips and said plurality of wires in block by resin;
   e) forming a plurality of soldering balls on said bottom surface of said wiring board;
   f) forming a plurality of semiconductor packages by individually separating said wiring board with said resin;

wherein, each of said plurality of semiconductor chips having:
   a silicon substrate;
   a plurality of transistors formed on the surface of said silicon substrate;
   a first insulating film of silicone oxide formed on said plurality of transistors;
   a multi layer wiring structure formed on said first insulating film;
   a second insulating film formed between wiring layers of said multi layer wiring structure, said second insulating film having a lower dielectric constant than said silicon oxide;
   and wherein, each of said semiconductor chips having an inclined surface on each of side surfaces thereof, said inclined surface being formed by cutting an upper surface of a semiconductor wafer by a blade having a processed V-shape at the tip thereof.

2. The method of manufacturing a semiconductor device according to claim 1, wherein said second insulating film is a SiOC film.

3. The method of manufacturing a semiconductor device according to claim 1, wherein said second insulating film is comprised of a material selected from a group of SiOF film, SiLK film, SiCN film, $SiO_2$ film containing a methyl group and Methyl Silses Quioxane film.

* * * * *